United States Patent
Jaenisch et al.

(10) Patent No.: US 10,937,465 B2
(45) Date of Patent: Mar. 2, 2021

(54) ANOMALY DETECTION WITH REDUCED MEMORY OVERHEAD

(71) Applicant: Raytheon Company, Waltham, MA (US)

(72) Inventors: Holger M. Jaenisch, Toney, AL (US); James W. Handley, Decatur, AL (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/281,888

(22) Filed: Feb. 21, 2019

(65) Prior Publication Data

US 2020/0273499 A1 Aug. 27, 2020

(51) Int. Cl.
*G06F 9/30* (2018.01)
*G06F 11/10* (2006.01)
*G11C 5/02* (2006.01)

(52) U.S. Cl.
CPC ............ *G11C 5/025* (2013.01); *G06F 9/3004* (2013.01); *G06F 11/1008* (2013.01)

(58) Field of Classification Search
CPC .... G11C 5/025; G06F 9/3004; G06F 11/1008
See application file for complete search history.

(56) References Cited

U.S. PATENT DOCUMENTS

| | | |
|---|---|---|
| 6,760,032 B1 | 7/2004 | James |
| 8,839,417 B1 | 9/2014 | Jordan |
| 9,245,116 B2 | 1/2016 | Evans et al. |
| 10,110,629 B1 | 10/2018 | Kruse et al. |
| 10,326,796 B1 | 6/2019 | Varadarajan et al. |
| 2003/0174895 A1* | 9/2003 | Hsieh ............... H04N 19/89 382/233 |
| 2006/0101516 A1 | 5/2006 | Sudaharan et al. |
| 2009/0241006 A1 | 9/2009 | Liikanen et al. |

(Continued)

FOREIGN PATENT DOCUMENTS

| | | |
|---|---|---|
| EP | 2942919 A1 | 11/2015 |
| WO | WO-2019199675 A1 | 10/2019 |

(Continued)

OTHER PUBLICATIONS

"International Application Serial No. PCT/US2019/026338, International Search Report dated Jun. 21, 2019", 5 pgs.

(Continued)

*Primary Examiner* — Nanci N Wong
(74) *Attorney, Agent, or Firm* — Schwegman Lundberg & Woessner, P.A.

(57) ABSTRACT

A method can include identifying, by processing circuitry of a device, a row of rows and/or column of columns to which a first feature and a second feature of an input maps, comparing the identified row and/or column to a row run length encoding (RLE) in a memory of the device that indicates, for each row, whether one or more cells in the row include an input mapped thereto or a column RLE in a memory of the device that indicates, for each column, whether one or more cells in the column include an input mapped thereto, respectively, and determining the input data is anomalous in response to determining either the row RLE indicates that no inputs are mapped to the row to which the input maps, or the column RLE indicates that no inputs are mapped to the column to which the input maps.

20 Claims, 8 Drawing Sheets

(56) References Cited

U.S. PATENT DOCUMENTS

| | | | |
|---|---|---|---|
| 2013/0145465 A1 | 6/2013 | Wang et al. | |
| 2015/0100556 A1* | 4/2015 | Sekiguchi | G06F 16/221 707/693 |
| 2015/0154796 A1* | 6/2015 | Co | G06T 17/20 345/420 |
| 2015/0206315 A1 | 7/2015 | Price et al. | |
| 2015/0295907 A1 | 10/2015 | Abrahamson | |
| 2016/0321323 A1 | 11/2016 | Gaumnitz et al. | |
| 2016/0359685 A1 | 12/2016 | Yadav et al. | |
| 2016/0359886 A1 | 12/2016 | Yadav et al. | |
| 2017/0149787 A1 | 5/2017 | Niemela et al. | |
| 2017/0257396 A1 | 9/2017 | Shen et al. | |
| 2017/0302691 A1 | 10/2017 | Singh et al. | |
| 2017/0310690 A1 | 10/2017 | Mestha et al. | |
| 2018/0027004 A1 | 1/2018 | Huang et al. | |
| 2018/0337935 A1 | 11/2018 | Marwah et al. | |
| 2019/0018375 A1* | 1/2019 | Deshpande | G05B 19/41855 |
| 2019/0196746 A1* | 6/2019 | Fujimoto | G06F 3/0608 |
| 2019/0279112 A1 | 9/2019 | Jaenisch et al. | |
| 2019/0289034 A1 | 9/2019 | Erez et al. | |
| 2019/0311120 A1 | 10/2019 | Jaenisch et al. | |
| 2019/0312908 A1 | 10/2019 | Jaenisch et al. | |
| 2019/0383874 A1 | 12/2019 | Jaenisch et al. | |
| 2020/0202749 A1 | 6/2020 | Jaenisch et al. | |
| 2020/0272731 A1 | 8/2020 | Jaenisch et al. | |
| 2020/0326695 A1 | 10/2020 | Jaenisch et al. | |

FOREIGN PATENT DOCUMENTS

| | | |
|---|---|---|
| WO | WO-2019199769 A1 | 10/2019 |
| WO | WO-2019199777 A1 | 10/2019 |
| WO | 2020172122 | 8/2020 |
| WO | 2020172124 | 8/2020 |

OTHER PUBLICATIONS

"International Application Serial No. PCT/US2019/026338, Written Opinion dated Jun. 21, 2019", 7 pgs.

"International Application Serial No. PCT/US2019/026514, International Search Report dated Jul. 5, 2019", 5 pgs.

"International Application Serial No. PCT/US2019/026514, Written Opinion dated Jul. 5, 2019", 8 pgs.

"International Application Serial No. PCT/US2019/026522, International Search Report dated Jul. 8, 2019", 4 pgs.

"International Application Serial No. PCT/US2019/026522, Written Opinion dated Jul. 8, 2019", 5 pgs.

Farlow, Stanley, "The GMDH Algorithm of Ivakhnenko", The American Statistician, vol. 35, No. 4, (1981), 210-215.

Ferreira, Candida, "Gene Expression Programming in Problem Solving", Soft Computing and Industry, (2002), 635-653.

Ferreira, Candida, "Gene Expression Programming: A New Adaptive Algorithm for Solving Problems", Complex Systems, vol. 13, issue 2, (2001), 22 pgs.

Gabor, D, et al., "A Universal Non-linear filter, predictor and simulator which optimizes", The Institution of Electrical Engineers, Paper No. 3270 M, (1960), 422-435.

Ivakhnenko, A G, "Heuristic Self-Organization in Problems of Engineering Cybernetics", Automatica, vol. 6, (1969), 207-219.

Ivakhnenko, A G, et al., "The Review of Problems Solvable by Algorithms of the Group Method of Data Handling (GMDH)", Pattern Recognition and Image Analysis, vol. 5, No. 4, (1995), 527-535.

Jaenisch, H, et al., "Generalized information fusion and visualization using spatial voting and data modeling", Society of Photo-Optical Instrumentation Engineers SPIE Proceedings vol. 8756 No. 875609, (May 2013), 16 pgs.

Jaenisch, Holger, et al., "A novel application of data modeling for extracting mathematical ontologies and relationship matrix features from text documents", SPIE Defense + Commercial Sensing, (2005), 12 pgs.

Jaenisch, Holger, et al., "A robust regularization algorithm for polynomial networks for machine-learning", Proc. SPIE 8059, Evolutionary and Bio-Inspired Computation: Theory and Applications V, 80590A, (May 2011), 21 pgs.

Jaenisch, Holger, et al., "Autonomous Journaling Response Using Data Model LUTS", Proc. of SPIE vol. 7344, (2009), 11 pgs.

Jaenisch, Holger, "Converting data into functions for continuous wavelet analysis", Proceedings of SPIE—The International Society for Optical Engineering, (pp. 2-13), (2009), 13 pgs.

Jaenisch, Holger, "Data Modeling Applications in Space Science and Astronomy", PhD thesis, James Cook University (pp. 1-130 of 255 pages total), (2009), 130 pgs.

Jaenisch, Holger, "Data Modeling Applications in Space Science and Astronomy", PhD thesis, James Cook University (pp. 131-256 of 255 pages total), (2009), 126 pgs.

Jaenisch, Holger, et al., "Data Modeling for Change Detection of Inventory Flow and Instrument Calibration", Proceedings of SOLE, (2003), 10 pgs.

Jaenisch, Holger, et al., "Data Modeling for Fault Detection", MFPT, (2003), 10 pgs.

Jaenisch, Holger, et al., "Data Modeling for network dynamics", Proceedings of SPIE—The International Society for Optical Engineering, (2004), 12 pgs.

Jaenisch, Holger, et al., "Data Modeling for Predictive Behavior Hypothesis Formation and Testing", Proc. SPIE 6241, Data Mining, Intrusion Detection, Information Assurance, and Data Networks Security, (2006), 12 pgs.

Jaenisch, Holger, et al., "Data-modeling-enabled guidance, navigation, and control to enhance the lethality of interceptors against maneuvering targets", Proceedings of SPIE—The International Society for Optical Engineering • (Mar. 2005), 13 pgs.

Jaenisch, Holger, et al., "Digital MicroArray Analysis for Digital Artifact Genomics", Cyber Sensing, (2013), 20 pgs.

Jaenisch, Holger, "Entropyology: Microarray Analysis Analogy for Digital Artifact Discrimination", Proceedings of SPIE, vol. 8359, (2012), 20 pgs.

Jaenisch, Holger, "Geospatial Feature Based Automatic Target Recognition (ATR) using data models", Proceedings vol. 7697, Signal Processing, Sensor Fusion, and Target Recognition XIX, (2010), 12 pgs.

Jaenisch, Holger, et al., "Insider Threat Detection Enabled by Converting User Applications into Fractal Fingerprints and Autonomously Detecting Anomalies", SPIE Proceedings vol. 8408, (2012), 22 pgs.

Jaenisch, Holger, et al., "Performance Comparison of the Prophecy (Forecasting) Algorithm in FFT Form for Unseen Feature and Time-Series Prediction", Proc. SPIE 8757, Cyber Sensing, (2013), 30 pgs.

Jaenisch, Holger, et al., "Shai-Hulud the quest for worm sign", Proc. SPIE 5812, Data Mining, Intrusion Detection, Information Assurance, and Data Networks Security, (2005), 9 pgs.

Jaenisch, Holger, et al., "Spatial Voting for Automatic Feature Selection, Fusion and Visualization", Proc. SPIE 8756, Multisensor, Multisource Information Fusion: Architectures, Algorithms, and Applications, (2013), 21 pgs.

Jaenisch, Holger, "Spatial Voting with Data Modeling", Sensor Fusions and its Applications, (2010), 153-178.

Jaenisch, Holger, et al., "Virtual Instrument Prototyping with Data Modeling", (2003), 15 pgs.

Kamalika, Bhattacharjee, et al., "A Survey of Cellular Automata: Types, Dynamics, Non-uniformity and Applications", Arxiv.Org, Cornell University Library, 201 Olin Library Cornell University Ithaca, NY, (Jul. 8, 2016).

Oltean, Mihai, et al., "An autonomous GP-based system for regression and classi?cation problems", Applied Soft Computing 9, (2009), 49-60.

"International Application Serial No. PCT/US2020/018570, International Search Report dated Apr. 28, 2020", 4 pgs.

"International Application Serial No. PCT/US2020/018570, Written Opinion dated Apr. 28, 2020", 7 pgs.

"International Application Serial No. PCT/US2020/018574, International Search Report dated Apr. 28, 2020", 4 pgs.

(56) References Cited

OTHER PUBLICATIONS

"International Application Serial No. PCT/US2020/018574, Written Opinion dated Apr. 28, 2020", 7 pgs.
"U.S. Appl. No. 16/379,154, Non Final Office Action dated Oct. 15, 2020", 25 pgs.

* cited by examiner

|    | C0 | C1 | C2 | C3 | C4 | C5 | C6 | C7 | C8 |
|----|----|----|----|----|----|----|----|----|----|
| R0 | 0  | 0  | 0  | 1  | 0  | 0  | 0  | 0  | 0  |
| R1 | 0  | 0  | 0  | 1  | 1  | 0  | 0  | 1  | 0  |
| R2 | 0  | 0  | 0  | 1  | 1  | 0  | 0  | 1  | 0  |
| R3 | 0  | 0  | 0  | 1  | 1  | 0  | 0  | 1  | 0  |
| R4 | 0  | 0  | 0  | 1  | 1  | 0  | 0  | 0  | 0  |
| R5 | 0  | 0  | 1  | 1  | 1  | 0  | 0  | 0  | 0  |
| R6 | 0  | 0  | 0  | 1  | 1  | 0  | 0  | 1  | 0  |
| R7 | 0  | 0  | 0  | 1  | 1  | 0  | 0  | 1  | 0  |
| R8 | 0  | 0  | 0  | 1  | 0  | 0  | 0  | 0  | 0  |

*FIG. 5*

ANOMALY DETECTION WITH REDUCED MEMORY OVERHEAD

TECHNICAL FIELD

Embodiments discussed herein regard devices, systems, and methods for reducing memory required for anomalous behavior detection.

BACKGROUND

Device security is a difficult and important task. Device security, such as cybersecurity, or information technology (IT) security is the protection of computer systems from theft or damage to their hardware, software, or electronic data, as well as from disruption or misdirection of the services they provide. The difficulty of implementing security increases on a device with limited memory or limited processor bandwidth.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 5 illustrates, by way of example, a diagram of an embodiment of an SV grid.

DETAILED DESCRIPTION

Figure 1:
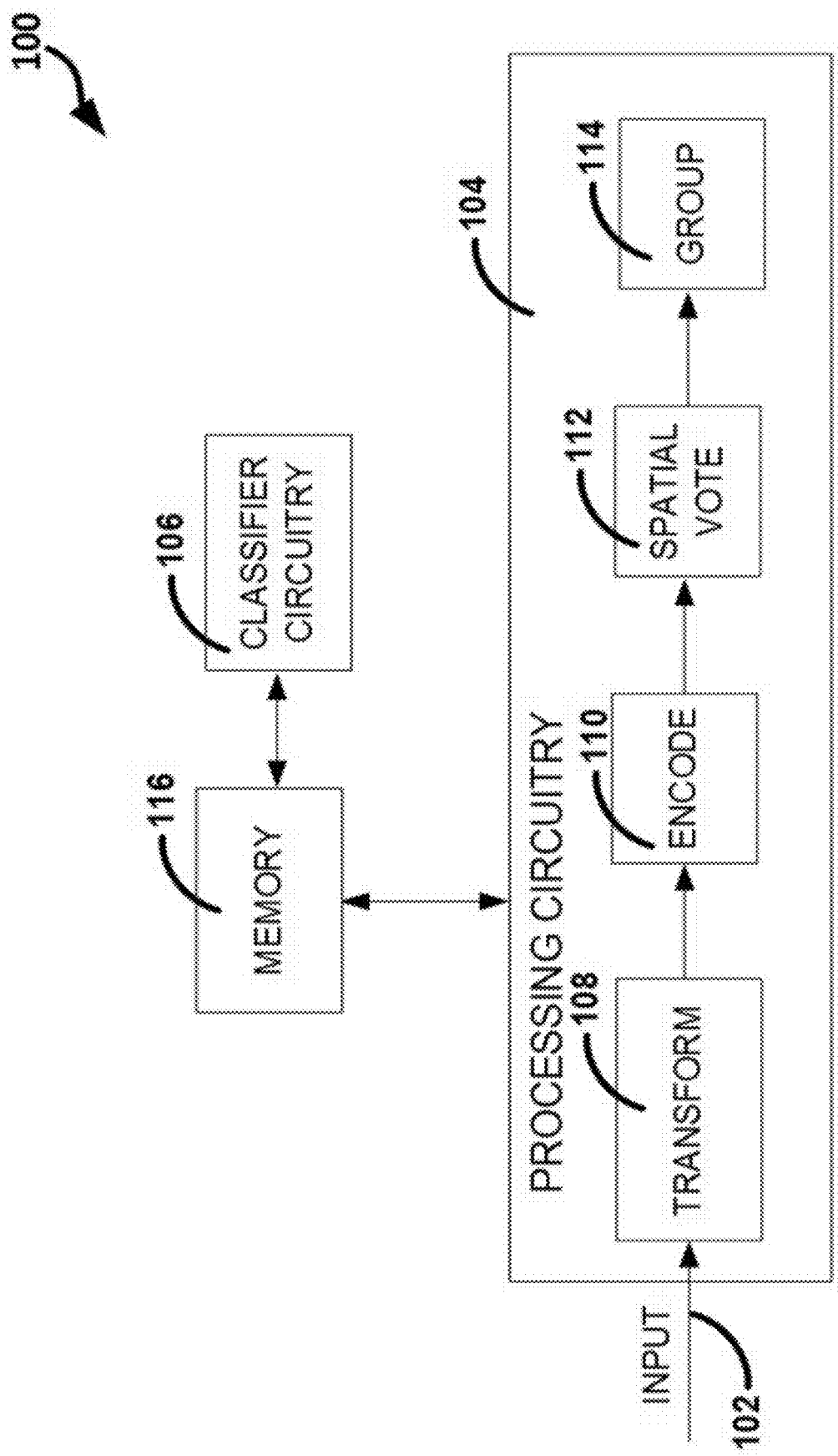
FIG. 1 illustrates, by way of example, a diagram of an embodiment of a system for anomaly detection.

Some embodiments relate to anomaly detection. An "anomaly", as used herein, means detected behavior not seen or experienced by the detection device before now. Embodiments can be agnostic to data type, format, source, or examples. Embodiments can be self-initializing, adaptive, and self-aware.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Embodiments can be embedded into firmware. Embodiments can be driven by sensor measurements including, but not limited to, voltages, currents, and any other physics-based parameters, as well as binary or digital data obtained from sensors or other nodes. Embodiments can use Information Theoretic Methods (ITM) to achieve compressive sensing encoding of data streams, files, sequences, packets, or a portion thereof that are order sensitive to the symbol sequence. The encoding can provide a hash-like function with nearness, removing external definitions of similarity, or a requirement for nearest neighbor calculations.

This disclosure uses for an illustrative use case, but is not limited to, cyber event or network data. The disclosure further illustrates how numeric encoding of data enables adaptive Spatial Voting (SV) grids and how the grids can be used to (automatically) detect a cyber-attack event.

Embodiments can use discrete mapping of a two-dimensional (2-D) scatter plot (sometimes called an SV grid) to establish a baseline pattern of populated grid cells that represents device behavior. Comparison can be achieved by calculating the grid cell assignment for a newly encoded data item, and testing if the cell index value already exists in a dictionary, lookup table (LUT), or run length encoding (RLE) of the SV grid. If it does, the data item is ignored as a minor variant of something previously encountered and a vote or stack count of a grid index (sometimes called a key value) can be incremented. However, if the proposed new grid key value does not already exist, the data item can be declared anomalous and can be recorded in an anomaly storage file and a new grid key added to the recognized key dictionary, LUT, or RLE.

Monitoring changes, such as across epochs, provides an ability to detect anomalies in a wide variety of situations. Applications can include packet or other data detection in a network (e.g., thumb drive insertion and the launch of a bot in the associated network, bus anomaly detection, corrupt packet detection and initialization when running simulations, finding packet fragments drift errors message types, or the like), device (e.g., helicopter, missile, airplane (e.g., associated 1553b system messaging and control bus, or the like), automotive vehicle (e.g, Controller Area Network (CAN bus) messaging, control busses, or the like), truck, radar, satellite, appliance, phone, computer, sensor, internet of things (IOT) device, embedded device, or the other manned or unmanned device, software or firmware based firewalls, black list/white list processes, malware or malicious behavior detection processes, surveillance systems including passive and active electromagnetic (EM) and non-EM based systems including large scale systems such as power generation facilities, manufacturing facilities, remote monitoring Facilities and any operational system of systems that uses active or passive "controllers" as part of the operation and decision making process both with and without and operation error detection (e.g., vibration fault detection, data fault detection, system configuration change detection, high priority alert thinning to relevant anomalies, query information variety discovery and unique information detection, natural language processing (NLP), entry matching such as in a maintenance log or other log (e.g., to directly associate entries about a same item or even when different technicians use different abbreviations or descriptions but are discussing a common symptom or part), matching job descriptions to resumes, text matching (e.g., finding documents that relate to search example of interest even if key words are absent), predicting time to failure (e.g., by monitoring how often new anomalies are detected as indication of system status change to a new or worse steady state), relevant detection of changes in scenes or video streams, such as full motion video real time feeds or isolating subset of frames from blurry movies or image streams enabling high resolution enhancement, such as for deep sky astronomy showing better performance than using adaptive optics as well as surveillance imagery, lossless compression of data extracting minimum relevant sub sample if data is sufficient for a secondary or tertiary decision making process, fusing multiple information sources to rapidly enable situation awareness such as in multi-intelligence (INT) scenarios, among others.

This disclosure describes an SV grid encoding process that reduces memory consumed by the SV grid. The disclosure further describes efficient methods of using the encoded SV grid data to determine whether a key value has been seen previously (is recognized or is an anomaly). Embodiments can provide an automated report. The report can be generated for an analyst. The report can isolate aspects of the behavior responsible for triggering the event along with confidence intervals and statistical tests of significance to isolate the behavior with relevant information.

Anomalies, as used herein, are defined as being "something never experienced before now". This definition inherently puts an order dependency or temporal component to the definition of anomaly.

Many devices, such as Internet of Things (IoT), or other devices are designed for form and thus have reduced memory resources available. Embodiments can allow for anomalous behavior detection in such devices. Thus, embodiments solve a problem of how to efficiently represent an SV grid in devices, such as embedded processors, with limited memory or primitive computational capability (e.g., controllers, such as peripheral interface controller (PIC), Arduino, Stamp, or other microcontroller). These embedded systems can be constrained with respect to processing power or memory usage. Using a matrix to represent the SV grid can be infeasible due to high memory use and potential reallocation of large chunks of memory. Hash tables can be infeasible since key values change when the SV grid changes in size, causing expensive table index recalculation. Embodiments can use an RLE of populated SV grid columns/rows. Such a representation requires only a finite number of tests to check for key existence. Such a representation provides an ability to operate in a fixed amount of memory regardless of how many new keys are discovered in the unbounded domain. As the number of keys grows, accumulated RLE info can be written into other processes for use on other nodes, such as to provide an inherited knowledge set.

A self-adapting SV grid can be enabled to auto adjust both its spatial extent and resolution. The adjustment can be driven by newly experienced encoded data. The first data item that creates a new grid cell "key value" can be identified. Any further data that encodes into an existing grid cell increases the stack count for the cell. These data can be deemed trivial variations of what has already been encountered. Such adaptive partitioning of data extracts relevant dynamic variants and yields what may be thought of as "margin points" or support vectors from support vector machine (SVM), but using an orthogonal and unrelated methodology. In some embodiments, no use of "truth" labels is made. In various embodiments, grouping and partitioning is done using information theory. Some embodiments can use encoded statistical estimators as (x, y) pairs that map to the SV grid. This is metaphorically similar to principal component 1 and principal component 2, but using none of the eigenvalue math/linear algebra principal component analysis (PCA) uses and obtaining the result in real-time. Various embodiments can be implemented on a multi-threaded process, such as in a distributed parallel fashion.

Reported events can include one or more anomalies. Runs of anomalies that fall more frequently outside a predicted area of regard region can signal a systemic persistent shift in observed system state and behavior, as opposed to intermittent spurious anomalies in recurring realms. These runs or individual anomalous operations can correspond to important behavior changes and can be alerted.

In literature, anomalies are synonymous with "bad behaviors". This is occurring in ML since, by definition, ML methods rely on "optimization strategies" to define decision boundaries and create classifiers with targeted "equal error rate". These ML methods are subject to the limitations of both Wolpert's No Free Lunch Theorem (NFL) and the Ugly Duckling Theorem. This is because ML classifiers measure differences and distinctions between two or more things. Whenever such a comparison is made it reduces mathematically to a set of ratios. For a given numerical value, there are an infinite number of numerator and denominator combinations that result in the same numerical equivalent value making the ratio concept non-unique. Thus, methods that require differencing require 2 or more classes to find differences and by definition cannot discover fundamental ab-initio traits that have a physics-based meaning. Hence the ability to learn only 1 class "normal" is intractable. Rather than admitting the in-admissibility of ML as method for detecting "anomalies", the ML community has attempted to cheat the math by taking what is normal and creating "artificial" data, to turn a single class case into a contrived two class case. The ML then proceeds by training. What is being learned is the differences between the normal data and the contrived data, which are very unlikely the same as the unknown-unknown data that has yet to be encountered, hence such classifiers when deployed suffer from at least two problems. These ML techniques make a class declaration (if 3 classes were trained on, one of the three will be declared no matter how unlikely they are, they simply report with a lower probability or confidence and the ML technique generally cannot return an "unknown" state). The need for confidences and probabilities leads to a third issue of having to set thresholds ad hoc and post hoc based on limited simulated testing and retesting upon failure. In all cases, a known equal error rate is minimized but specificity of one (e.g., no false positives) is not obtainable, hence it is known generally how many false positives to expect at best with no means of ferreting them out.

Truly detecting an unknown-unknown can include context that is created in-situ as data is processed and encountered, thus yielding experience. The process can then, upon organizing what has been seen into partitions of similar based on numeric binning, determine if the new data falls into an existing bin or not. If it does, it is not novel (it is recognized). If it does not, then it has never been encountered before and is an anomaly and worthy of further reconsideration in a post process or downstream inspection.

Some embodiments can include "self-aware" and fully adaptive processes. Self-awareness, as used herein, means defining self in terms of aggregate of experiences and an ability to discern a new stimulus as being either self or not self This self-awareness eliminates traditional training and need for labeled data, it yields data thinning to relevant cases, and enables self-supervised classifiers and detectors to be created and employed upstream of itself, filter out with black/white list capability those things which have been encountered before to disregard them. The self-supervised classifier can generate labels of temporal group and key index values. The labels can be replaced with human interpretable grammar without requiring any change in the defined groupings and encoded mappings into such groups.

Embodiments can make a determination much faster than a k-means clustering technique used on the same data. First, embodiments include no training time. Second, embodiments include simpler, more cost-effective processing eliminating the need for k-means clustering while autonomously partitioning data into groups that preserve similarity. Embodiments can eliminate the need for random selection of data starting points, eliminate the need to define the number of clusters to look for or attempt to assign the data to, and eliminate a subsequent Monte Carlo rerun and artificial monitoring for subjective convergence of cluster number and membership.

Innovative aspects can include, but are not limited to: reduction of memory space required to describe an entire extent of an SV grid, and increased processor efficiency (fewer compute cycles) in determination of whether behavior is an anomaly.

Various embodiments described herein provide streaming and real-time enabled embedded anomaly detection of type and format agnostic data sets. Some embodiments include proven anomaly detection maintained while performance "throughput" and "stability of execution time" is improved. Various embodiments demonstrate that the system is fully adaptive and self-initializing requiring no a priori training data to function correctly.

FIG. 1 illustrates, by way of example, a diagram of an embodiment of a system 100 for anomaly detection. The system 100 as illustrated includes processing circuitry 104, classifier circuitry 106, and a memory 116. The processing circuitry 104 can identify an anomaly (a behavior that has not been seen by the processing circuitry 104 up to the point the behavior is seen). The classifier circuitry 106 can present the anomaly to a user for action, adjust SV grid parameters, or the like. The memory 116 can store key values, SV grid parameters, or other data input or output from the processing circuitry 104.

The processing circuitry 104 receives input 102. The input 102 can include binary data, text, signal values, image values, or other data that can be transformed to a number. The processing circuitry 104 can transform the input 102 to a number, at operation 108. The operation 108 can include encoding the input into a specified format, parsing the data into chunks (e.g., chunks of a specified size), or the like. For example, the operation 108 can include encoding text input to an American Standard Code for Information Interchange (ASCII) encoding to transform the input 102 into numbers between zero (0) and two hundred fifty-five (255). In another example, the operation 108 can include converting chunks of binary data to their numerical equivalent, such as two's complement, unsigned integer, floating number (e.g., short or long), or the like. In yet another example, the operation 108 can include performing an analog to digital conversion on analog signal data, such as by an analog to digital converter. In yet another example, the operation 108 can include combining red, green, blue (RGB) values of a color image, or the like, to generate a number. Not all input 102 needs to be transformed, thus the operation 108 is optional.

The processing circuitry 104 can receive numbers either as raw input 102 or from the operation 108 and encode the numbers into two features (discussed below) at operation 110. The operation 110 is order-sensitive, such that the same inputs received in a different order encode (likely encode) to different features.

Examples of features include RM, RS, SM, SS, TM, TS, OC1, OC2, and OCR (discussed below). These calculations are performed in the sequence shown so that they can be calculated in a single pass across the data element where a value derived by an earlier step is used in an antecedent step directly and all calculations are updated within a single loop. RM can be determined using Equation 1:

$$RM_i=(RM_{i-1}+X_i)/2 \qquad \text{Equation 1}$$

In Equation 1, $X_i$ is the ith input value for i=1, 2, . . . n.

RS can be determined using Equation 2:

$$RS_i = \left(RS_{i-1} + \sqrt{\frac{(X_i - RM_i)^2}{2}}\right)/2 \qquad \text{Equation 2}$$

SM can be determined using Equation 3:

$$SM_i=\Sigma X_i/n \qquad \text{Equation 3}$$

SS can be determined using Equation 4:

$$SS_i=\sqrt{(SS_{i-1}+(X_i-SM_i)^2)/(n-1)} \qquad \text{Equation 4}$$

TM can be determined using Equation 5:

$$TM_i=(TM_{i-1}+SM_{i-1})/2 \qquad \text{Equation 5}$$

TS can be determined using Equation 6:

$$TS_i = \left(TS_{i-1} + \sqrt{\frac{(X_i - TM_i)^2}{2}}\right)/2 \qquad \text{Equation 6}$$

Orthogonal component 1 (OC1) can be determined using Equation 7:

$$OC1_i=(RM_i+SM_i+TM_i)/3 \qquad \text{Equation 7}$$

Orthogonal component 2 (OC2) can be determined using Equation 8:

$$OC2_i=(RS_i+SS_i+TS_i)/3 \qquad \text{Equation 8}$$

Orthogonal component rollup (OCR) can be determined using Equation 9:

$$OCR_i=OC1_i+OC2_i \qquad \text{Equation 9}$$

There is no "best" encoding for all use cases (Ugly Duckling Theorem limitation). Each set of encoding features used as (x, y) pairs will yield a different but valid view of the same data, with each sensitive to a different aspect of the same data. "R" features tend to group and pull together, "S" features tend to spread out, "T" features tend to congeal data into fewer groups but sub groups tend to manifest with much more organized structure, and "OC" features tend to produce the most general spread of data. "OC" features most resemble PC1 and PC2 of traditional Principal Component Analysis (PCA) without the linear algebra for eigenvectors.

Each feature is now described in more detail with suggested application:

R-type feature—Associates data into closer, less spread groups, guaranteed to be bounded in SV data space if the encoding is bounded and the SV space is similarly bounded (e.g., if ASCII encoding is used and the x and y extent are bounded from [000]-[255]). R-type features are recommended when the dynamic variability in data is unknown (typically initial analysis). This can be refined in subsequent analysis. R-type features will tend to group data more than other features.

S-type feature—Tends to spread the data out more. How the encoded data spreads can be important, so things that stay together after spreading are more likely to really be similar. S-type features produce a potentially unbounded space. S-type features tend to spread data along one spatial grid axis more than another. Note, if the occupied cells in the SV spatial grid fall along a 45 degree line, then the 2 chosen stat types are highly correlated and are describing the same aspects of the data. When this occurs, it is generally suggested that one of the compressive encoding features be changed to a different one.

T-type feature—These compressive encoding features are sensitive to all changes, and are used to calculate running mean and running sigma exceedances. T-type features can provide improved group spreading over other features types. T-type features tend to spread data along both axes.

OC-type feature—Orthogonal Components, which are simple fast approximations to PCA (Principal Component Analysis). The OC1 component is the average of RM, SM, and TM, OC2 is the average of RS, SS, and TS, and OCR is the sum of OC1 and OC2.

Note that while two variants of each type of feature are provided (e.g., RS and RM are each a variant of an R-type feature) cross-variants can provide a useful analysis of data items. For example, if an RS or RM is used as feature 1, any of the S-type features, T-type features, or OC-type features can also be used as feature 2. Further, two of the same feature can be used on different data. For example, TS on a subset of columns of data from a row in a comma separated values (CSV) data file can form a feature 1, while TS on the same row of data but using a different subset of columns can form a feature 2.

In some embodiments, one or more features can be determined based on length of a corresponding data item. The length-based features are sometimes called LRM, LRS, LSM, LSS, etc.

The features of Equations 1-9 are order-dependent. The features can be plotted against each other on a grid of cells, at operation 112. The processing circuitry 104 can initialize an SV grid to which the encoded inputs are mapped, such as at operation 112.

Plotted values can be associated or correlated, such as at operation 114. The operation 114 can include forming groups of mapped inputs and determining an extent thereof. More details regarding the operations 108-114 are provided in FIGS. 2-4.

The classifier circuitry 106 can provide a user with a report indicating behavior that is anomalous. An input mapped to a cell that was not previously populated is considered anomalous. If an input is mapped to a cell that already has an input mapped thereto by the features, the input can be considered recognized or known. Since some applications can be memory limited, an entity can opt to have few cells in an SV grid. For these cases, it can be beneficial to determine an extent that an encoded value is situated away from a center of a cell. If the encoded value is a specified distance away from the center or a center point (e.g., as defined by a standard deviation, variance, confidence ellipse, or the like), the corresponding data item can be considered anomalous. Such embodiments allow for anomaly detection in more memory-limited devices.

The classifier circuitry 106, in some embodiments, can indicate in the report that an input known to be malicious was received. The report can include the input, the group (if applicable) to which the cell is a member, a number of consecutive inputs, a last non-anomalous data item, a subsequent non-anomalous data-item, such as for behavioral analysis or training, or the like. The classifier circuitry 106 can indicate, in the report, different types of anomalies. For example, a type 1 anomaly can indicate a new behavior that falls within an area of regard (AOR). A type 2 anomaly can indicate a new behavior that falls outside of an area of regard. An area of regard can be determined based on one or more prior anomaly detection epochs. In a given epoch, there can be one or more areas of regard. An anomaly detection epoch is a user-defined interval of analyzing a number of inputs, a time range, or the like. The epoch can be defined in the memory 116 and monitored by the processing circuitry 104.

In some embodiments, an event for the report can include a single anomalous behavior. In some embodiments, an event for the report can be reported in response to a specified threshold number of type 2 anomalies.

The classifier circuitry 106 can adjust SV grid parameters. An initial size of an SV grid cell can be determined. In some embodiments, the initial size of the SV grid cell can include dividing the space between (0, 0) and the encoded (x, y) of the first input data item into an N×N SV grid, where N is the initial number of cells on a side of the SV grid (for example, a 16×16 SV grid would break up the distance in x and in y to the first data point from the origin into 16 equal divisions).

As new input data items are introduced and encoded, whenever one fall outside the extent of the SV grid, the N×N SV grid can be increased in size to (N+1)×(N+1) until either the new input data item is included on the resized SV grid, or N becomes equal to the maximum allowed number of SV grid cells on a side of the SV grid. After N becomes a defined maximum SV grid size (for example 64×64), and a new input data item falls off of the current SV grid, the size of each SV grid cell size can be increased so that the SV grid encompasses the new data point.

As either the number of SV grid cells on a side or the overall extent of the SV grid in x and y are increased to encompass new input data items, the SV grid column (Equation 14), SV grid row (Equation 15), and key index value (Equation 16) can be changed to map the populated SV grid cells from the previous SV grid to the newly size one. To accomplish this, the center (x, y) value of each populated SV grid cell can be calculated using the minimum and maximum x and y values and the number of SV grid cells in the previous SV grid, and then mapping the centers and their associated SV grid counts onto the new SV grid using Equations 14, 15, and 16. This is done using the following equations:

$$\text{Row}=\text{int}(\text{Key Value}/(\text{number of cells on side})) \quad \text{Equation 10}$$

$$\text{Col}=\text{Key Value}-\text{int}(\text{Row}*(\text{number of cells on side})) \quad \text{Equation 11}$$

$$\text{Center 1}=x\ \text{min}+\text{Col}*(x\ \text{range})/(\text{num.col}-1) \quad \text{Equation 12}$$

$$\text{Center 2}=y\ \text{min}+\text{Row}*(y\ \text{range})/(\text{num.row}-1) \quad \text{Equation 13}$$

The values for Center 1 and Center 2 can then be used in Equations 14, 15, and 16 (below) as Feature 1 and Feature 2 to calculate the new Key Value for each populated cell on the new SV grid.

Figure 2:
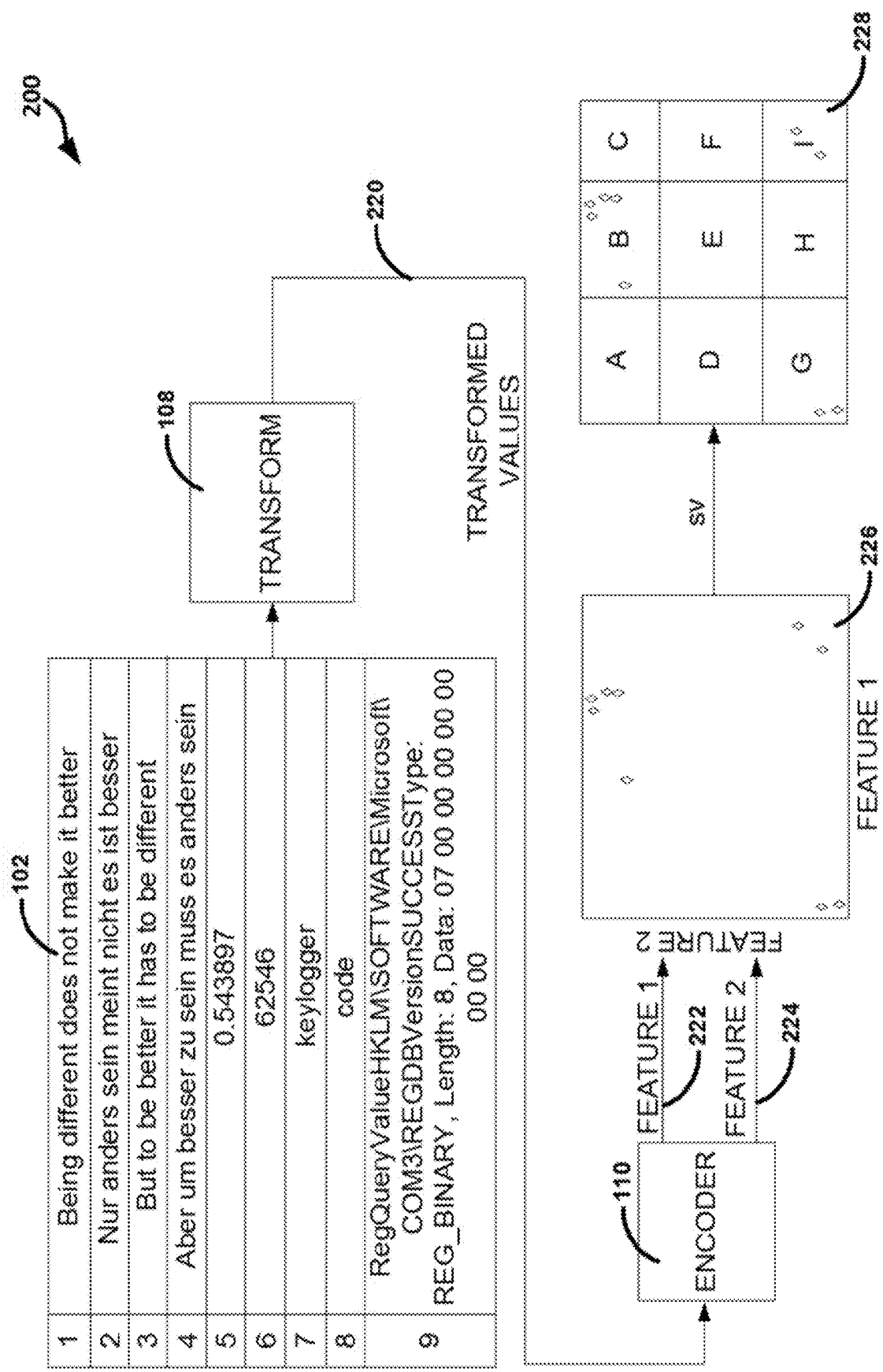
FIG. 2 illustrates, by way of example, a diagram of an embodiment of a method for identifying an anomalous behavior.

FIG. 2 illustrates, by way of example, a diagram of an embodiment of a method 200 for identifying an anomalous behavior. The method 200 as illustrated includes receiving the input 102. The input 102 in FIG. 2 includes nine text strings labelled "1"-"9". Each of the text strings "1"-"9" of the input 102 is respectively transformed to transformed values 220 at operation 108. An example transformation is ASCII encoding which transforms text to numerical values. The transformed values 220 can be used to perform the operation 110. The operation 110 can include determining two features 222, 224 of the input 102 and plotting them against each other to form a feature graph 226. The features 222, 224 can include, for example, RM, RS, SM, SS, TM, and TS, in some embodiments.

Consider the input data item "1". Each character of the input data item "1" can be transformed to an ASCII value. The features can be determined based on the ASCII encoding of the entire string. That is, $X_i$, is the ASCII value of each character and the features are determined over all ASCII encodings of the characters of the input data item "1". As an example, the resultant RM can be feature 1 222 and the resultant RS can be feature 2 224, or vice versa. This is merely an example and any order-dependent feature can be chosen for feature 1 and any order-dependent feature chosen for feature 2. Each of the input data items "1"-"9" can be processed in this manner at operation 108 and 110.

The graph 226 can then be split into cells to form a grid 228. The cells of FIG. 2 are labelled "A"-"I" for illustration (we will introduce Key Values to numerically label the SV grid cells in Equation 16). Inputs 102 mapped to a same cell can be considered similar. Inputs 102 mapped to an empty cell can be considered anomalous. In the grid 228, input data items "1"-"4" (sentences in English and German) are mapped to cell "B", input data items 5-6 (numbers) are mapped to cell "I", and input data items "7-8" (words) are mapped to cell "G". Input data item 9, which is a combination of words, numbers, and other characters, maps to cell "B" indicating that input data item "9" is more like a sentence than a word or number. If a subsequent input data item 102 were to be received and mapped to cell "A", "C", "D", "E", "F", or "H" it can be deemed anomalous, as it is a behavior that has not been received before and is sufficiently different from other behaviors that have been seen previously.

As can be seen, whether an input is considered an anomaly is dependent on a size of a cell. The size of the cell can be chosen or configured according to an operational constraint, such as a size of a memory, compute bandwidth, or the like. The size of a cell can be chosen or configured according to a desired level of security. For example, a higher level of security can include more cells, but require more memory and compute bandwidth to operate, while a lower level of security can include fewer cells but require less memory and bandwidth to operate.

Figure 3:
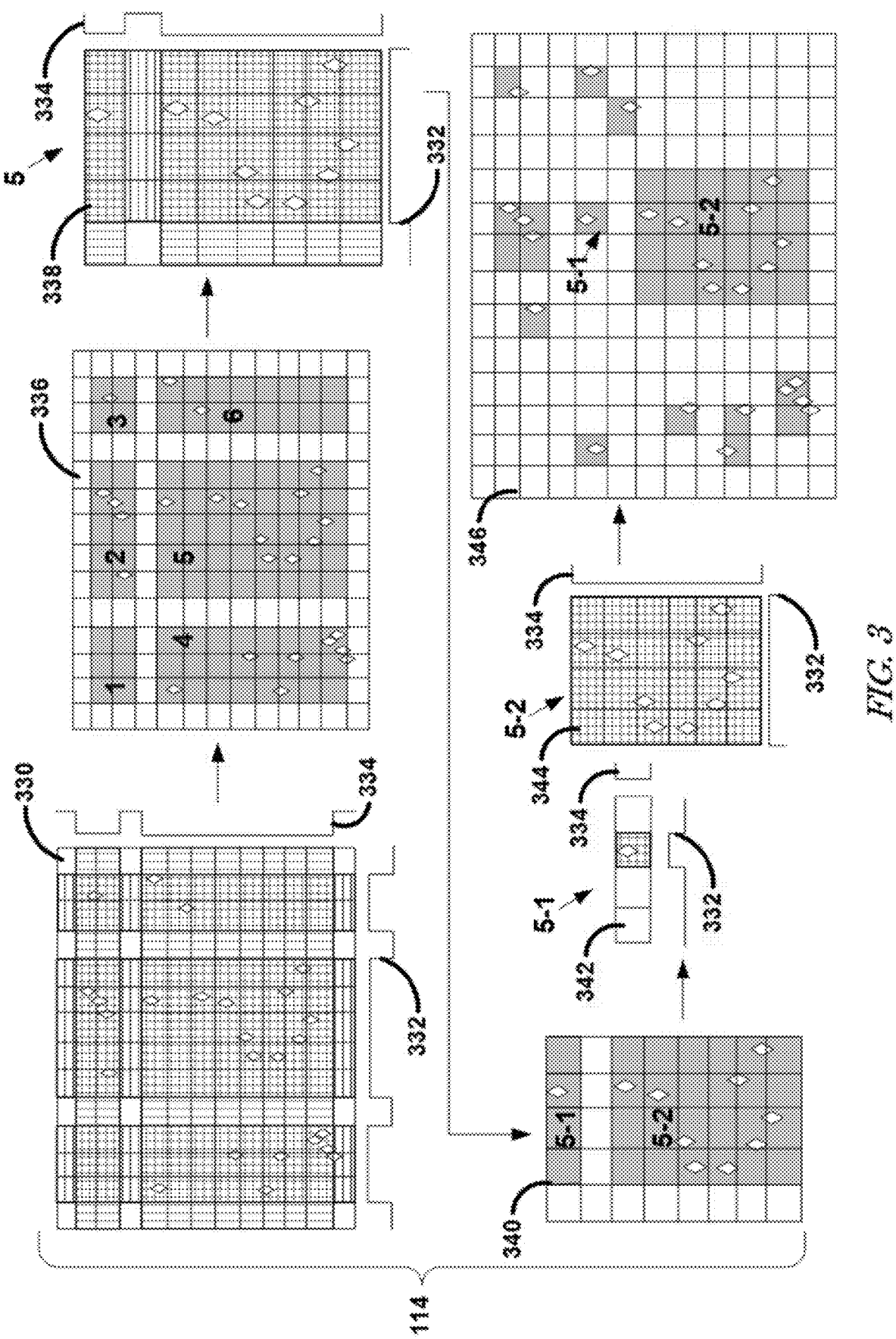
FIG. 3 illustrates, by way of example, a diagram of an embodiment of a grouping operation.

FIG. 3 illustrates, by way of example, a diagram of an embodiment of the operation 114. Encoded inputs ((x, y) points) are represented by diamonds. The operation 114 (sometimes called shadowing for group extraction) can include an iterative process that identifies cells that are populated and aggregates and separates those cells into groups. The iterative process can include:

1) Identifying cells of columns with at least one populated cell at operation 332 (indicated by horizontal hashing in graph 330)
2) Identifying cells of rows with at least one populated cell at operation 334 (indicated by vertical hashing in graph 330)
3) For each cell identified at both (1) and (2) (indicated by cross-hashing in the cell), (a) aggregate with all contiguous cells identified at both (1) and (2), (b) assign aggregated cells to a group, and (c) label the group with a key
4) Repeat (1)-(3) for each group/sub-group until no change.

A graph 336 illustrates the result of a first iteration of performing the operations (1)-(3). After the first iteration, six groups "1"-"6" in FIG. 3 are formed. Next each of the groups "1"-"6" are processed by operations (1)-(3). In FIG. 3, the second iteration is illustrated for group "5". The operations 332 and 334 can be performed on a sub-grid 338 formed by the cells of group "5". A graph 340 illustrates the result of the second iteration of performing the operations (1)-(3). After a second iteration on group "5", two subgroups "5-1" and "5-2" are formed in the example of FIG. 3.

In the example of FIG. 3, a third iteration of the operations (1)-(3) is performed on the subgroups "5-1" and "5-2". The operations 332 and 334 can be performed on sub-grids 342, 344 formed by the cells of sub-groups "5-1" and "5-2". A graph 346 illustrates the result of the performing all iterations of the operations (1)-(3) and the groups formed therefrom.

In some embodiments, the number of cells can be adaptive, such as to be adjusted during runtime as previously discussed. Related to this adaptive cell size is determining the location of an encoded input in the grid and a corresponding key value associated with the encoded input. An example of determining the location in the grid includes using the following equations (for an embodiment in which feature 1 is plotted on the x-axis and feature 2 is plotted on the y-axis):

$$\text{Col}=\text{int}((\text{feature 1}-x\text{ min})*(\text{num.col}-1)/(x\text{ range})) \quad \text{Equation 14}$$

$$\text{Row}=\text{int}((\text{feature 2}-y\text{ min})*(\text{num.row}-1)/(y\text{ range})) \quad \text{Equation 15}$$

An encoding on the grid, sometimes called key value, can be determined using Equation 16:

$$\text{Key Value}=\text{num.row}*\text{Row}+\text{Col} \quad \text{Equation 16}$$

The "x min", "y min", "x max", and "y max" can be stored in the memory 116. Other values that can be stored in the memory 116 and relating to the grid of cells include "max grid size", "min grid size", or the like. These values can be used by the processing circuitry 104 to determine "x range", "num. col.", "y range", or "num. row", such as to assemble the grid of cells or determine a key value for a given encoded input (e.g., (feature 1, feature 2)).

A series of key values representing sequential inputs can be stored in the memory 116 and used by the classifier circuitry 106, such as to detect malicious (not necessarily anomalous) behavior. A malicious or other behavior of interest can be operated on by the processing circuitry 104 and the key values of the behavior can be recorded. The key values can be stored and associated with the malicious behavior. Key values subsequently generated by the processing circuitry 104 can be compared to the key values associated with the malicious behavior to detect the malicious behavior in the future.

Figure 4:
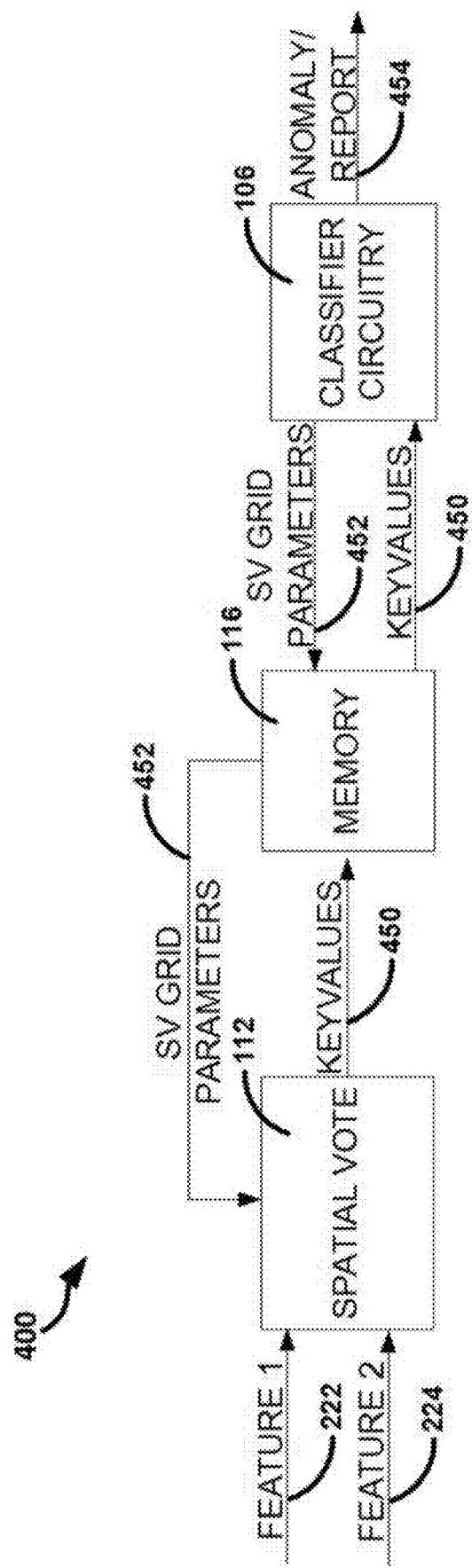
FIG. 4 illustrates, by way of example, a diagram of an embodiment of a system for anomaly detection.

FIG. 4 illustrates, by way of example, a diagram of an embodiment of a system 400 for anomaly detection. The system 400 includes an exploded view diagram of a portion of the system 100. The system 400 as illustrated includes the operation 112 of the processing circuitry 104, the memory 116, and the classifier circuitry 106. The operation 112 determines key values 450 based on SV grid parameters 452 from the memory 116 and features 222, 224 determined by the processing circuitry 104.

The key values in the memory 116 can allow for F-testing, t-testing, or Z-score analysis, such as by the classifier circuitry 106. These analyses can help identify significant columns and cells. The classifier circuitry 106 can provide event and pre-event logs in a report 454, such as for further analysis. The report 454 can provide information on which column or cell corresponds to the most different behavior.

As may be evident, an SV grid can be cumbersome to store. As the resolution of the SV grid increases (e.g., more, smaller cells corresponds to a higher resolution than fewer, larger cells), the more data is required to store the SV grid and the previously seen behaviors (in the form of key values). For the SV grid to be used in devices with more limited memory, a more efficient description of the SV grid can be beneficial.

FIG. 5 illustrates, by way of example, a diagram of an embodiment of an SV grid 500 with 81 cells (9×9 grid of cells). The SV grid 500 is shown with each cell 502 populated with a behavior indicator. The behavior indicator is either one (1) or zero (0) in the example of FIG. 5. In the example of FIG. 5, a behavior indicator of "1" in a cell 502 indicates that at least one behavior (an input) has been mapped to that cell previously (the behavior has been seen or is similar to a behavior seen previously), while a behavior indicator of "0" in a cell 502 indicates that a behavior has not previously been mapped to that cell.

One way to store the SV grid 500 would be to store data indicating an overall extent of the SV grid 500, an extent of each cell 502, a cell identification (ID) (sometimes called a key value) with each cell 502, and behavior indicator that identifies whether an input has been mapped to the cell 502. The amount of memory consumed by such storage becomes prohibitively cumbersome as the number of cells of the SV grid 500 increases.

Primitive languages, such as American National Standards Institute (ANSI) C, only support lists of strings for string variable assignment. Thus, storing key values as strings in a list leads to a growing list length that must be fully searched every new data instance to determine if the key value exists. Lack of formal GOTO statements where a string key value could be defined and used as demarcator and a potential GOTO statement jump to it directly is not possible in the C implementation of GOTO and case statements are not feasible either. Resorting a growing list of keys to make jumping efficient is computationally too expensive for embedded real time use and requires ever growing array space, thus allowing only storing keys as they occur generating an apparent random sequence unique to each use case run. When the list grows, the growth slows down the search time to determine if a key exists and then requires appending to the growing list a new key for the new anomaly just encountered and slowing the next search even more. One solution includes replacing one global list of keys with multiple lists, one for groups and another for keys within each respective group. This allows testing for extent of groups from a shorter list of group extents. If and only if a match with an existing group is encountered is the list of keys within each respective group searched for the existence of the sought key. This vastly increases the number of data points that can be stored and quickly searched because the data space has been auto-partitioned into groups first and then reduced to searching keys within a single group.

This process for very large spaces and runs and possibly using the same SV space for vastly different use cases that populate large spatially separate regions of the SV grid (which can occur if packet data is processed in one use case and thereby learned from experience and the same SV grid is now run against an ASCII character plain-English text data set), the encoded values can map far away from the encoded values of small fixed length packets. However, knowledge transfer from the packet space to include the parsed and reconstructed payload and ASCII text within the packets can now be encompassed with one global SV accumulated experience base. The problem is now that the list of groups is growing large (as the original number of keys grew large before) and eventually searching a list of group extents slows down as did searching a global list of key extents did as well.

So the problem is not alleviated by partitioning of search spaces into lists alone. The process of grouping, such as by shadowing (see FIG. 3), can be an external process imposed at the conclusion of an epoch run and thus does not qualify as a true ITM driven solely of data compressively sensed content. A method for achieving auto-partitioning with the SV grid represented in an efficient string form and a method of reducing and bounding the maximum number of tests required to determine if a key exists is mandatory to achieve fixed memory embedded processing is desired and discussed herein.

A more efficient representation of the SV grid 500 can include the overall extent of the SV grid 500, a delta extent of each cell 502 in the feature 1 and feature 2 directions, a row run length encoding (RLE), a column RLE, and an RLE encoding of all cells of a row or column that includes a cell with a behavior indicator that indicates an input has been mapped to the cell. Any row or column that does not include any cell with a behavior indicator that indicates an input has been mapped to the cell can remain unencoded and no data for that particular row or column needs to be stored beyond an indication that the row or column does not include an input mapped thereto.

An RLE is an Information Theoretic form of lossless compression in which runs of data are stored as a single data entry indicating a value and a count indicating the number of consecutive entries of the value, rather than storing each instance in the run. For example, consider the binary sequence "00000111100000". An RLE of the sequence can include an indication of the first value, the number of consecutive instances of the value, the second value, the number of consecutive instances of the second value, etc. In an RLE of a binary sequence, the second value and all subsequent values can be skipped as there are only two alternating values "0" and "1". Further, the final run can be excluded from the encoding as long as the length of the sequence being encoded is known. The presented binary sequence can thus be encoded as {0, 5, 4}. The "0" indicates the starting value is the binary "0", the "5" indicates that there is a run of five such "0"s, the "4" indicates that the next four values are "1"s, and if it is known that the sequence is fourteen characters long, the lack of data indicates that the final five values of the sequence must all be "0"s. If the length of the sequence is unknown, the RLE can be {0, 5, 4, 5} to indicate that the sequence ends with five zeros. These two RLE sequences can be efficiently and compactly represented as ASCII strings "0,5,4,5" or "0,5,4" respectively or for certain ASIC and register memory only based systems can be converted into a special long integer form by permanently starting with "1" so leading zero does not vanish forming the integers 10545 and 1054 respectively.

The row RLE and column RLE can indicate whether there are any cells in a respective row or column that include an input mapped thereto. For example, consider the SV grid 500. A row RLE can include {1, 9}. This RLE indicates that each row R0-R8 includes at least one cell with an input mapped thereto. A column RLE for the SV grid 500 can include {0, 2, 3, 2, 1}. This column RLE indicates that columns C0, C1 include no cells with an input mapped thereto, the next three columns C2, C3, C4 include at least one cell with an input mapped thereto, the next two columns C5, C6 include no cells with an input mapped thereto, the next column C7 includes at least one cell with an input mapped thereto, and the last column C8 includes no cells with an input mapped thereto.

The RLE for each column that includes at least one cell with an input mapped thereto can include a similar structure. In the example of FIG. 5, an RLE for each of columns C2, C3, C4, and C5 can be generated and stored. With the encoding of the columns, the grid cell size and extent, an entire SV grid image mask can be re-created without loss. There is no attempt made to preserve counts, only determination of presence. Counts are not necessary to be stored within the SV gridding process and can be stored off-line if needed as a Group based Markov model updated every data point or at the end of an epoch or by means of lists of group-key files updated by adding +1 to their current value, which can be done offline and is not necessary to achieve or facilitate self-aware anomaly detection based on experience to date.

Figure 6:
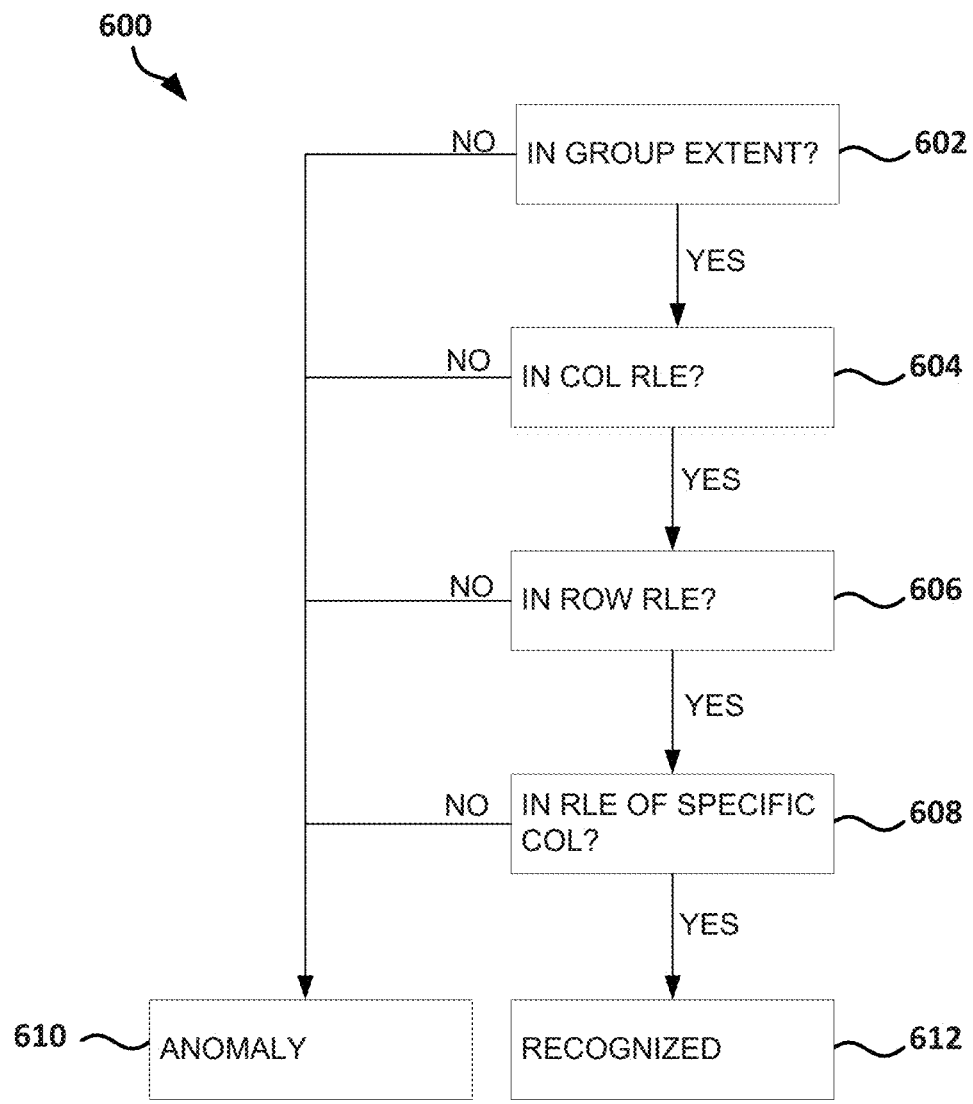
FIG. 6 illustrates, by way of example, a diagram of an embodiment of a method for identifying whether a key value is anomalous based on an RLE of an SV grid.

FIG. 6 illustrates, by way of example, a diagram of an embodiment of a method 600 for identifying whether a key value is anomalous based on an RLE of an SV grid. The method 600 as illustrated includes determining whether a point (e.g., [feature 1, feature 2]) to which the input is mapped is in a group extent, at operation 602; whether the column to which the point is mapped (see Equation 14) is in a column RLE, at operation 604; whether the row to which the point is mapped (see Equation 15) is in a row RLE, at operation 606; and whether the row and column to which the point is mapped is in an RLE of the specific column, at operation 608. If, at any of the operations of the method 600, the test fails, the input is determined to be an anomaly, at operation 610. If, at any of the operations of the method 600, the test succeeds, the method 600 continues to the next operation. If all operations 602, 604, 606, and 608 succeed, the input is determined to be recognized at operation 612.

The operation 602 can include comparing the feature 1 value to feature 1 extents of one or more groups and if feature 1 falls within an extent of a group, the feature 2 value can be compared to the feature 2 extent of the group. Groups were discussed with regard to FIG. 3. In general, a group is an association of mapped points determined to be similar, such as by their proximity to one another or their presence in a cell or subset of cells. FIG. 3 illustrates multiple iterations of a grouping process. The group extents to which the operation 602 compares the mapped input can be defined after one or more of the iterations of the grouping process (and removal of any empty groups). The group extent can include (1) a minimum and maximum for both features of all input mapped to the group or (2) a minimum and maximum for cells to which the inputs of the group are mapped. That is, the group extent can be defined by the potential maximum allowable number of cells allowed to represent a group based on a priori memory limitations pre-defining the full extent of a group that contains only a single occupied cell, the mapped input extent of points in the group, or the like. For groups of only a single point, the cell extent to which the input is mapped can define the group extent.

The operations 604 and 606 are similar, but for different RLEs. Consider the previous row RLE and column RLE discussed regarding FIG. 5. The row RLE indicates, for each row of the SV grid, whether there are one or more cells in the row that include an input mapped thereto or there are no cells in the row that include an input mapped thereto. The column RLE indicates, similarly, for each column of the SV grid, whether there are one or more cells in the row that include an input mapped thereto or there are no cells in the column that include an input mapped thereto. Thus, at operation 604, whether a given column has any cells with any inputs mapped thereto can be determined using the column RLE. Similarly, at operation 606, it can be determined whether a given row has any cells with any inputs mapped thereto using the row RLE.

At operation 604, if the column RLE indicates that the column to which the input is mapped includes an input mapped thereto, operation 606 can be performed. At operation 606, if the row RLE indicates that the row to which the input is mapped includes an input mapped thereto, operation 608 can be performed.

At operation 608, the RLE of the specific column to which an input is mapped can be analyzed to determine if a specific cell in the column has had an input mapped thereto. If so, the input can be considered recognized, at operation 612. A stack count indicating the number of inputs that have been mapped to the cell to which the input is mapped can be incremented.

If any one of the operations 602, 604, 606, and 608 fails, the input can be considered anomalous at operation 610. In response to determining that an input is anomalous at operation 610, one or more of the following can be updated: (1) the row RLE that includes the cell to which the input is mapped can be updated, (2) the column RLE that includes the cell to which the input is mapped can be updated, and (3) the specific column (or row) RLE that includes the cell to which the input is mapped can be updated. The update can reflect that the column, row, or cell now has an input mapped thereto. Thus, if a subsequent input is mapped to the same cell, that input will be deemed recognized at operation 612.

Note that the order of the operations of the method 600 can be changed. For example, operations 606 and 608 can be swapped. Note also, that operations 602, 604, and 606 are optional, but can reduce an amount of time it takes to determine whether an input is anomalous or recognized.

In classifying inputs a distinction may be made between 1) Groups that are defined by extent and therefore may have empty cells allowing any new data that falls inside the existing Group to be declared as "Being inside of a recognized group but with a new or anomalous key", versus 2) a brand new Group being defined that would be an "unrecognized group that when populated forms anomalous new keys within the unrecognized group". Thus, it it can be important to make sure that recognized versus unrecognized are not necessarily synonyms for anomalous versus nominal. For certain use cases, this distinction can be important and enable expected variations that are new keys within recognized groups to be treated with one level of significance different from data generating a brand new group and/or also populating new keys outside of any existing recognized group. By observing ratios of the within recognized group new keys as "expected variations" and those forming new Groups as "unexpected variations", significant discrimination between the two distinctions is achievable without additional calculations or external provided threshold criteria that introduces heuristics rather than relying on pure Information Theoretic strategies and methods of embodiments. Note further that not all of the row RLE, column RLE, or RLE of specific column (or row) may need to be updated in response to identifying an anomaly. For example, if, at operation 604, it is determined that the column RLE indicates that the column to which the input is mapped has had an input previously mapped thereto, the column RLE need not be updated. A similar update to the row RLE is not needed if the operation 606 indicates that the row to which the input is mapped has had an input previously mapped thereto.

In another example, consider that, at operation 602 an input is determined to map to a group. The remaining operations 604, 606, 608 can be constrained to searching the column RLE, row RLE, or RLE of the specific column only within the extent of the group to which the input is determined to map. That is, the entire extent of the column RLE, row RLE, or RLE of the specific column need be searched as it was determined at operation 602 that the input was mapped to a group with a defined extent. The remaining operations can be constrained to searching on the defined extent of the group.

Figure 7:
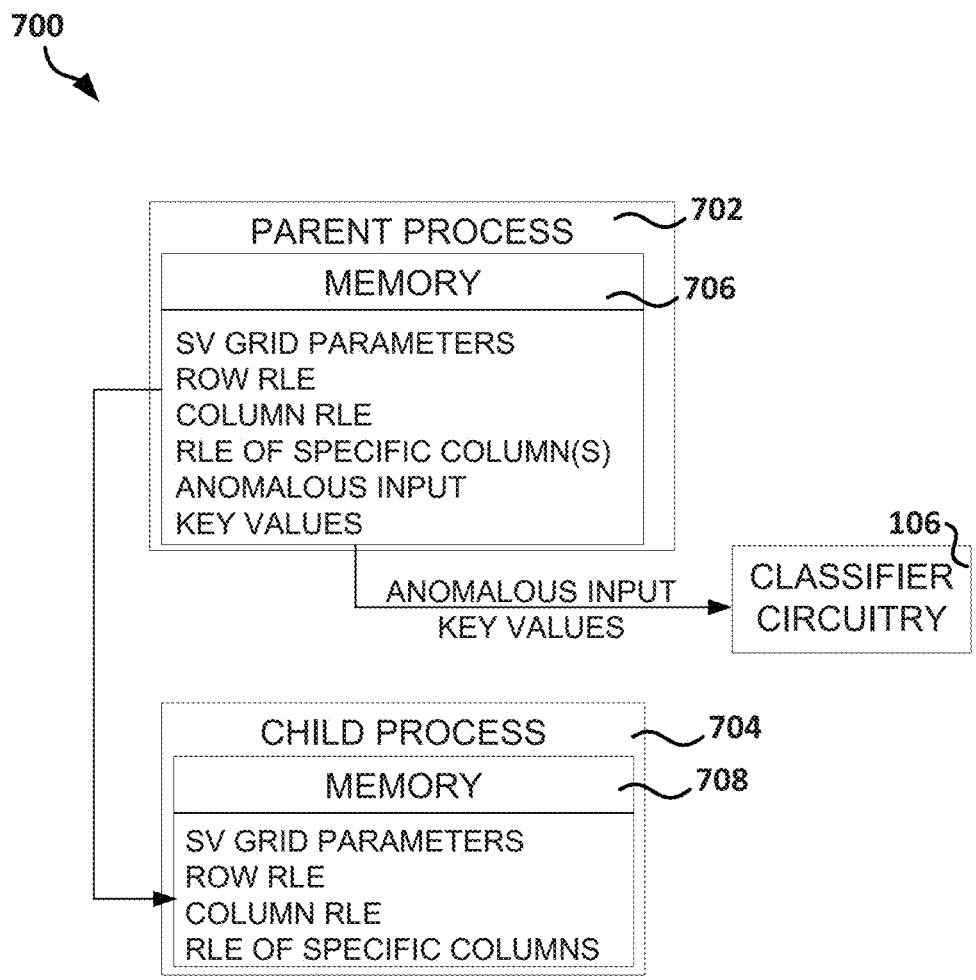
FIG. 7 illustrates, by way of example, a diagram of an embodiment of a system for behavior monitoring.

FIG. 7 illustrates, by way of example, a diagram of an embodiment of a system 700 for behavior monitoring. The system 700 as illustrated includes a parent process 702, a child process 704, and the classifier circuitry 106. The parent process 702 can be monitoring behavior of one or more devices. The parent process 702, during operation, can store SV grid parameters, such as a maximum feature 1 value, maximum feature 2 value, minimum feature 1 value, minimum feature 2 value, cell size, number of cells (e.g., number of rows and number of columns), an origin of the SV grid, or the like. The row RLE can indicate whether one or more cells of each row of the SV grid include an input mapped thereto. The column RLE can indicate whether one or more cells of each column of the SV grid include an input mapped thereto. The RLE of specific column(s) (or row(s)) can indicate, for each column with an input mapped thereto (as indicated by the column RLE), whether each cell of the column includes an input mapped thereto. The anomalous input can include the data corresponding to the raw input that was determined to be anomalous. The key values can include a series of key values to which the input received at the parent process is mapped.

As the amount of data stored in the memory 706 passes a threshold amount of data or a specified amount of time has passed, a specified time has passed, or a threshold number of inputs have been processed, the parent process 702 can offload at least a portion of its memory 706 to the child process 704. The child process 704 can be monitoring the same or similar devices as the parent process 702. The child process 704 can thus "inherit" the data of the parent process 702 and operate with the knowledge of the parent.

Since an RLE can be stored as a variable type "string", the RLEs can be stored in a register memory. As the RLEs and the representation of the SV grid (separate from the data regarding the monitored behavior) can have a maximum, small length, the behavior monitoring can be performed on an embedded device. The RLE representation and testing the RLE representation for anomalous or recognized behavior eliminates an exhaustive search of a list of keys and the need for sorting such lists in memory.

Using the RLE of the SV grid grouping of closely associated SV grid keys is still possible. Further, anomalous behavior detection of type 1 (expected anomalies) and type 2 (unexpected-unknown-unknown anomalies) can be accomplished, still without a priori training nor assumption of anomaly characteristics.

Embodiments, in general represent the virtual SV grid as columns (or rows) that either do or do-not contain a populated key (0\1). If a populated SV grid is examined along the horizontal feature 1 axis, each x location can be defined as a column of feature 2 cells. Such a column is frequently sparse (as suggested by empirical evidence) and has more empty cells than populated ones making RLE an attractive lossless compression representation.

Embodiments can create an RLE of a specific column for those columns that contain one or more populated cells in feature 2. The feature 1 axis can be represented as its own RLE, to quickly indicate which feature 1 columns have one or more inputs mapped thereto. This short form column RLE makes checking the calculated feature 1 value to a specific feature 1 location a single test. If the column RLE indicates that the column has had no inputs mapped thereto, there can be no populated key corresponding to that column and the data can be declared anomalous. The RLEs can be updated to define the new key populated by the row. If the feature 1 value maps to a column that has had an input mapped thereto, a second test can be done on the feature 2 axis RLE (row RLE) to determine which, if any, row RLE contains the populated cell. This test quickly identifies the feature 2 index value and defines the unique name of the feature 2 RLE possibly containing the exact cell\key index. The list of defined feature 2 RLEs can be indexed using "GOTO" supported in C and CUDA, thus bypassing sequential searching the correct RLE string found and parsed to determine if the cell is present if so then the data is nominal.

By knowing how much register memory an embedded device has, a limit can be placed, a priori, on how many RLE sequences can be held in active memory versus those that are compiled into source code as string variables. The hardwired RLE sequence strings can define the knowledge contained by the SV grid of the parent process 702. The exportation of C, CUDA, or other programming language classifiers in source code that contain the RLE strings defined as string variables is possible with the RLE encoding. This structure is accommodated by the compiler, thus eliminating the need for memory allocation (malloc) yet enabling anomaly detection to occur using the encoded SV grid. Using RLE, it is no longer necessary to store key index values, since these can be determined during execution and written into output messages from the process, thereby enabling presence/absence testing for storage in source code.

Further, an RLE representation of an SV grid can be programmed in hardware. For example, a transistors can be biased in such a manner that they produce a sequence of bits that is the RLE encodings of the SV grid. As the SV grid encodings change, the biasing of the transistors can change. In this manner, the complete knowledge of the SV grid can be embedded in hardware. Such a hardware embedding can evade reverse engineering and protect knowledge of the SV grid.

Figure 8:
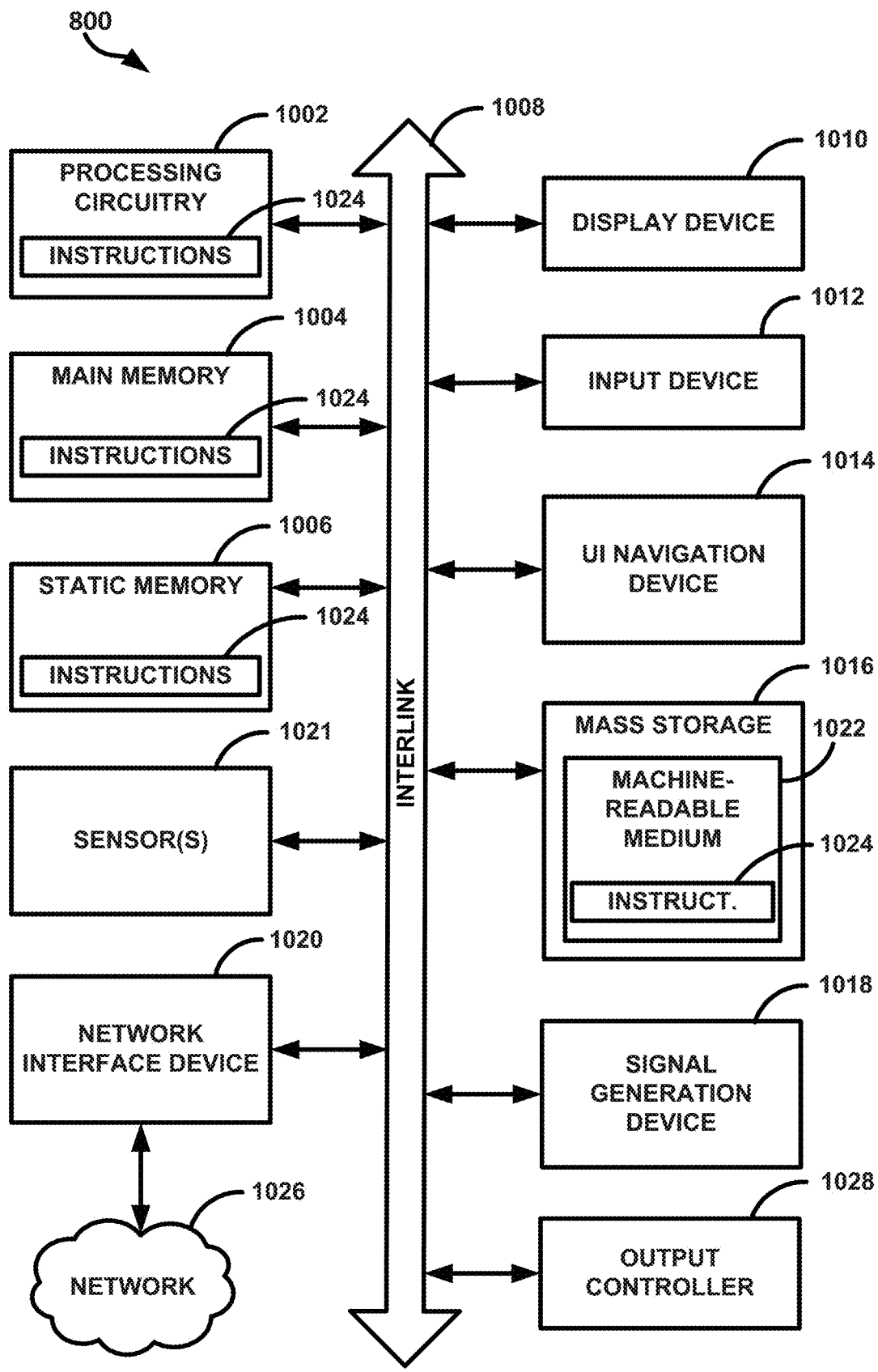
FIG. 8 illustrates, by way of example, a block diagram of an embodiment of a machine in the example form of a computer system within which instructions, for causing the machine to perform any one or more of the methodologies discussed herein, may be executed.

FIG. 8 illustrates, by way of example, a block diagram of an embodiment of a machine 800 on which one or more of the methods, such as those discussed about FIGS. 1-7 and elsewhere herein can be implemented. In one or more embodiments, one or more items of the system 100, 400, and 700 can be implemented by the machine 800. In alternative embodiments, the machine 800 operates as a standalone device or may be connected (e.g., networked) to other machines. In one or more embodiments, one or more items of the system 100, 400, and 700 can include one or more of the items of the machine 800. In a networked deployment, the machine 800 may operate in the capacity of a server or a client machine in server-client network environment, or as a peer machine in a peer-to-peer (or distributed) network environment. The machine 800 may be a personal computer (PC), a tablet PC, a set-top box (STB), a Personal Digital Assistant (PDA), a cellular telephone, a web appliance, a network router, switch or bridge, embedded computer or hardware, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example machine 800 includes processing circuitry 1002 (e.g., a hardware processor, such as can include a central processing unit (CPU), a graphics processing unit (GPU), an application specific integrated circuit, circuitry, such as one or more transistors, resistors, capacitors, inductors, diodes, logic gates, multiplexers, oscillators, buffers, modulators, regulators, amplifiers, demodulators, or radios (e.g., transmit circuitry or receive circuitry or transceiver circuitry, such as RF or other electromagnetic, optical, audio, non-audible acoustic, or the like), sensors 1021 (e.g., a transducer that converts one form of energy (e.g., light, heat, electrical, mechanical, or other energy) to another form of energy), or the like, or a combination thereof), a main memory 1004 and a static memory 1006, which communicate with each other and all other elements of machine 800 via a bus 1008. The transmit circuitry or receive circuitry can include one or more antennas, oscillators, modulators, regulators, amplifiers, demodulators, optical receivers or transmitters, acoustic receivers (e.g., microphones) or transmitters (e.g., speakers) or the like. The RF transmit circuitry can be configured to produce energy at a specified primary frequency to include a specified harmonic frequency.

The machine 800 (e.g., computer system) may further include a video display unit 1010 (e.g., a liquid crystal display (LCD) or a cathode ray tube (CRT)). The machine 800 also includes an alphanumeric input device 1012 (e.g., a keyboard), a user interface (UI) navigation device 1014 (e.g., a mouse), a disk drive or mass storage unit 1016, a signal generation device 1018 (e.g., a speaker) and a network interface device 1020.

The mass storage unit 1016 includes a machine-readable medium 1022 on which is stored one or more sets of instructions and data structures (e.g., software) 1024 embodying or utilized by any one or more of the methodologies or functions described herein. The instructions 1024 may also reside, completely or at least partially, within the main memory 1004 and/or within the processing circuitry 1002 during execution thereof by the machine 800, the main memory 1004 and the processing circuitry 1002 also constituting machine-readable media. One or more of the main memory 1004, the mass storage unit 1016, or other memory device can store the data of the memory 706, 708 for executing a method discussed herein.

The machine 800 as illustrated includes an output controller 1028. The output controller 1028 manages data flow to/from the machine 800. The output controller 1028 is sometimes called a device controller, with software that directly interacts with the output controller 1028 being called a device driver.

While the machine-readable medium 1022 is shown in an example embodiment to be a single medium, the term "machine-readable medium" may include a single medium or multiple media (e.g., a centralized or distributed database, and/or associated caches and servers) that store the one or more instructions or data structures. The term "machine-readable medium" shall also be taken to include any tangible medium that can store, encode or carry instructions for execution by the machine and that cause the machine to perform any one or more of the methodologies of the present invention, or that can store, encode or carry data structures utilized by or associated with such instructions. The term "machine-readable medium" shall accordingly be taken to include, but not be limited to, solid-state memories, and optical and magnetic media. Specific examples of machine-readable media include non-volatile memory, including by way of example semiconductor memory devices, e.g., Erasable Programmable Read-Only Memory (EPROM), Electrically Erasable Programmable Read-Only Memory (EEPROM), and flash memory devices; magnetic disks such as internal hard disks and removable disks; magneto-optical disks; and CD-ROM and DVD-ROM disks.

The instructions 1024 may further be transmitted or received over a communications network 1026 using a transmission medium. The instructions 1024 may be transmitted using the network interface device 1020 and any one of several well-known transfer protocols (e.g., hypertext transfer protocol (HTTP), user datagram protocol (UDP), transmission control protocol (TCP)/internet protocol (IP)). The network 1026 can include a point-to-point link using a serial protocol, or other well-known transfer protocol. Examples of communication networks include a local area network ("LAN"), a wide area network ("WAN"), the Internet, mobile telephone networks, Plain Old Telephone (POTS) networks, and wireless data networks (e.g., WiFi and WiMax networks). The term "transmission medium" shall be taken to include any intangible medium that can store, encode or carry instructions for execution by the machine, and includes digital or analog communications signals or other intangible media to facilitate communication of such software.

Examples and Additional Notes

Example 1 can include an apparatus for device behavior anomaly detection. The apparatus can include a memory including data indicating a cell size, a number of columns of cells, a number of rows of cells, a row run length encoding (RLE) that indicates, for each row, whether one or more cells in the row include an input mapped thereto and a column RLE that indicates, for each column, whether one or more cells in the column include an input mapped thereto, processing circuitry coupled to the memory, the processing circuitry being configured to identify a row of the rows and/or column of the columns to which a first feature and a second feature of an input maps, compare the identified row and/or column to the row RLE or the column RLE, respectively, and determine the input data is anomalous in response to determining either (1) the row RLE indicates that no inputs are mapped to the row of the rows to which the input maps, or (2) the column RLE indicates that no inputs are mapped to the column of the columns to which the input maps.

In Example 2, Example 1 can further include, wherein the processing circuitry is further configured to, in response to determining the input data is anomalous, (1) update the row RLE to indicate that an input is mapped thereto if it was determined the row RLE indicates that no inputs are mapped thereto or (2) update the column RLE to indicate that an input is mapped thereto if it was determined the column RLE indicates that no inputs are mapped thereto.

In Example 3, Example 2 can further include, wherein the processing circuitry is further to cause the row RLE and the column RLE to be written to a memory of another device.

In Example 4, at least one of Examples 1-3 can further include, wherein the processing circuitry is further to group cells into groups based on their proximity and whether an input has been mapped thereto and wherein the memory includes data identifying one or more groups and data indicating minimum and maximum extents for both first and second features for each group.

In Example 5, Example 4 can further include, wherein the processing circuitry is further configured to compare the identified row and column to the group extents to determine whether the identified row and column falls within a group of the one or more groups, and in response to determining the identified row and column do not fall within any groups of the one or more groups, determine the input data is anomalous.

In Example 6, Example 5 can further include, wherein comparing the identified row and column to the group extents occurs before comparing the identified row and/or column to the row RLE or the column RLE, respectively.

In Example 7, at least one of Examples 1-6 can further include, wherein the memory further includes data indicating a specific column RLE that indicates, for each column that includes one or more inputs mapped thereto, whether each cell of the column includes an input mapped thereto and wherein the processing circuitry is further configured to determine the input data is anomalous in response to determining either the specific column RLE indicates that no inputs are mapped to the cell to which the input maps.

Example 8 includes a method for device behavior anomaly detection, the method comprising identifying, by processing circuitry of a device, a row of rows and/or column of columns to which a first feature and a second feature of an input maps, comparing the identified row and/or column to a row run length encoding (RLE) in a memory of the device that indicates, for each row, whether one or more cells in the row include an input mapped thereto or a column RLE in a memory of the device that indicates, for each column, whether one or more cells in the column include an input mapped thereto, respectively, and determining the input data is anomalous in response to determining either (1) the row RLE indicates that no inputs are mapped to the row of the rows to which the input maps, or (2) the column RLE indicates that no inputs are mapped to the column of the columns to which the input maps.

In Example 9, Example 8 further includes, in response to determining the input data is anomalous, (1) updating the row RLE in the memory to indicate that an input is mapped thereto if it was determined the row RLE indicates that no inputs are mapped thereto or (2) updating the column RLE in the memory to indicate that an input is mapped thereto if it was determined the column RLE indicates that no inputs are mapped thereto.

In Example 10, at least one of Examples 8-9 further includes causing the row RLE and the column RLE to be written to a memory of another device.

In Example 11, at least one of Examples 8-10 further includes grouping cells into groups based on their proximity and whether an input has been mapped thereto and wherein the memory includes data identifying one or more groups and data indicating minimum and maximum extents for both first and second features for each group.

In Example 12, Example 11 further includes comparing the identified row and column to the group extents to determine whether the identified row and column falls within a group of the one or more groups, and in response to determining the identified row and column do not fall within any groups of the one or more groups, determining the input data is anomalous.

In Example 13, Example 12 further includes, wherein comparing the identified row and column to the group extents occurs before comparing the identified row and/or column to the row RLE or the column RLE, respectively.

In Example 14, at least one of Examples 8-13 further includes, wherein the memory further includes data indicating a specific column RLE that indicates, for each column that includes one or more inputs mapped thereto, whether each cell of the column includes an input mapped thereto and the method further comprises determining the input data is anomalous in response to determining either the specific column RLE indicates that no inputs are mapped to the cell to which the input maps.

Example 15 includes a non-transitory machine-readable medium including instructions stored thereon that, when executed by a machine, cause the machine to perform operations comprising identifying a row of rows and/or column of columns to which a first feature and a second feature of an input maps, comparing the identified row and/or column to a row run length encoding (RLE) in a memory of the device that indicates, for each row, whether one or more cells in the row include an input mapped thereto or a column RLE in a memory of the machine that indicates, for each column, whether one or more cells in the column include an input mapped thereto, respectively, and determining the input data is anomalous in response to determining either (1) the row RLE indicates that no inputs are mapped to the row of the rows to which the input maps, or (2) the column RLE indicates that no inputs are mapped to the column of the columns to which the input maps.

In Example 16, Example 15 further includes, wherein the operations further include, in response to determining the input data is anomalous, (1) updating the row RLE in the memory to indicate that an input is mapped thereto if it was determined the row RLE indicates that no inputs are mapped thereto or (2) updating the column RLE in the memory to indicate that an input is mapped thereto if it was determined the column RLE indicates that no inputs are mapped thereto.

In Example 17, Example 16 further includes, wherein the operations further include causing the row RLE and the column RLE to be written to a memory of another device.

In Example 18, at least one of Examples 15-17 further includes, wherein the operations further include grouping cells into groups based on their proximity and whether an input has been mapped thereto, the memory includes data identifying one or more groups and data indicating minimum and maximum extents for both first and second features for each group, the operations further include comparing the identified row and column to the group extents to determine whether the identified row and column falls within a group of the one or more groups, and the operations further include, in response to determining the identified row and column do not fall within any groups of the one or more groups, determining the input data is anomalous.

In Example 19, Example 18 further includes, wherein comparing the identified row and column to the group extents occurs before comparing the identified row and/or column to the row RLE or the column RLE, respectively.

In Example 20, at least one of Examples 15-19 further includes, wherein the memory further includes data indicating a specific column RLE that indicates, for each column that includes one or more inputs mapped thereto, whether each cell of the column includes an input mapped thereto and wherein the operations further include determining the input data is anomalous in response to determining either the specific column RLE indicates that no inputs are mapped to the cell to which the input maps.

Although an embodiment has been described with reference to specific example embodiments, it will be evident that various modifications and changes may be made to these embodiments without departing from the broader spirit and scope of the invention. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

What is claimed is:

1. A method for device behavior anomaly detection, the method comprising:

identifying, by processing circuitry of a device, a row of cells of rows of cells and/or column of cells of columns of cells to which a first feature or a second feature of data of an input maps, respectively, a grid of cells comprises the rows and columns of cells, and the grid of cells includes values of the first feature along the rows and values of the second feature along the columns;

comparing the identified row and/or column to a row run length encoding (RLE) in a memory of the device that indicates, for each row, whether one or more cells in the row include data of an input mapped thereto or a column RLE in a memory of the device that indicates, for each column, whether one or more cells in the column include data of an input mapped thereto, respectively; and determining the input data is anomalous in response to determining either (1) the row RLE indicates that no inputs are mapped to the row of the rows to which the input maps, or (2) the column RLE indicates that no inputs are mapped to the column of the columns to which the input maps.

2. The method of claim 1, further comprising, in response to determining the input data is anomalous, (1) updating the row RLE in the memory to indicate that an input is mapped thereto if it was determined the row RLE indicates that no inputs are mapped thereto or (2) updating the column RLE in the memory to indicate that an input is mapped thereto if it was determined the column RLE indicates that no inputs are mapped thereto.

3. The method of claim 2, further comprising causing the row RLE and the column RLE to be written to a memory of another device.

4. The method of claim 1, further comprising grouping cells into groups based on their proximity and whether an input has been mapped thereto and wherein the memory includes data identifying one or more groups and data indicating minimum and maximum extents for both first and second features for each group.

5. The method of claim 4, further comprising:

comparing the identified row and column to the group extents to determine whether the identified row and column falls within a group of the one or more groups; and in response to determining the identified row and column do not fall within any groups of the one or more groups, determining the input data is anomalous.

6. The method of claim 5, wherein comparing the identified row and column to the group extents occurs before comparing the identified row and/or column to the row RLE or the column RLE, respectively.

7. The method of claim 1, wherein the memory further includes data indicating a specific column RLE that indicates, for each column that includes one or more inputs mapped thereto, whether each cell of the column includes an input mapped thereto and the method further comprises determining the input data is anomalous in response to determining either the specific column RLE indicates that no inputs are mapped to the cell to which the input maps.

8. A non-transitory machine-readable medium including instructions stored thereon that, when executed by a machine, cause the machine to perform operations comprising:

identifying a row of cells of rows of cells and/or column of cells of columns of cells to which a first feature or a second feature of data of an input maps, respectively, a grid of cells comprises the rows and columns of cells, and the grid of cells includes values of the first feature along the rows and values of the second feature along the columns;

comparing the identified row and/or column to a row run length encoding (RLE) in a memory of the device that indicates, for each row, whether one or more cells in the row include data of an input mapped thereto or a column RLE in a memory of the machine that indicates, for each column, whether one or more cells in the column include data of an input mapped thereto, respectively; and determining the input data is anomalous in response to determining either (1) the row RLE indicates that no inputs are mapped to the row of the rows to which the input maps, or (2) the column RLE indicates that no inputs are mapped to the column of the columns to which the input maps.

9. The non-transitory machine-readable medium of claim 8, wherein the operations further include, in response to determining the input data is anomalous, (1) updating the row RLE in the memory to indicate that an input is mapped thereto if it was determined the row RLE indicates that no inputs are mapped thereto or (2) updating the column RLE in the memory to indicate that an input is mapped thereto if it was determined the column RLE indicates that no inputs are mapped thereto.

10. The non-transitory machine-readable medium of claim 9, wherein the operations further include causing the row RLE and the column RLE to be written to a memory of another device.

11. The non-transitory machine-readable medium of claim 8, wherein:

the operations further include grouping cells into groups based on their proximity and whether an input has been mapped thereto;

the memory includes data identifying one or more groups and data indicating minimum and maximum extents for both first and second features for each group;

the operations further include comparing the identified row and column to the group extents to determine whether the identified row and column falls within a group of the one or more groups; and the operations further include, in response to determining the identified row and column do not fall within any groups of the one or more groups, determining the input data is anomalous.

12. The non-transitory machine-readable medium of claim 11, wherein comparing the identified row and column to the group extents occurs before comparing the identified row and/or column to the row RLE or the column RLE, respectively.

13. The non-transitory machine-readable medium of claim 8, wherein the memory further includes data indicating a specific column RLE that indicates, for each column that includes one or more inputs mapped thereto, whether each cell of the column includes an input mapped thereto and wherein the operations further include determining the input data is anomalous in response to determining either the specific column RLE indicates that no inputs are mapped to the cell to which the input maps.

14. An apparatus comprising:
a memory including data indicating, for cells of a grid of cells, a cell size, a number of columns of cells in the grid, a number of rows of cells in the grid, a row run length encoding (RLE) that indicates, for each row in the grid, whether one or more cells in the row include an input mapped thereto and a column RLE that indicates, for each column in the grid, whether one or more cells in the column include an input mapped thereto;
processing circuitry coupled to the memory, the processing circuitry being configured to:
identify a row of the rows and/or column of the columns to which a first feature and a second feature of data of an input maps, respectively, the grid including values of the first feature along the rows and values of the second feature along the columns;
compare the identified row and/or column to the row RLE or the column RLE, respectively; and
determine the input data is anomalous in response to determining either (1) the row RLE indicates that no inputs are mapped to the row of the rows to which the input maps, or (2) the column RLE indicates that no inputs are mapped to the column of the columns to which the input maps.

15. The apparatus of claim 14, wherein the processing circuitry is further configured to, in response to determining the input data is anomalous, (1) update the row RLE to indicate that an input is mapped thereto if it was determined the row RLE indicates that no inputs are mapped thereto or (2) update the column RLE to indicate that an input is mapped thereto if it was determined the column RLE indicates that no inputs are mapped thereto.

16. The apparatus of claim 15, wherein the processing circuitry is further to cause the row RLE and the column RLE to be written to a memory of another device.

17. The apparatus of claim 14, wherein the processing circuitry is further to group cells into groups based on their proximity and whether an input has been mapped thereto and wherein the memory includes data identifying one or more groups and data indicating minimum and maximum extents for both first and second features for each group.

18. The apparatus of claim 17, wherein the processing circuitry is further to:
compare the identified row and column to the group extents to determine whether the identified row and column falls within a group of the one or more groups; and
in response to determining the identified row and column do not fall within any groups of the one or more groups, determine the input data is anomalous.

19. The apparatus of claim 18, wherein comparing the identified row and column to the group extents occurs before comparing the identified row and/or column to the row RLE or the column RLE, respectively.

20. The apparatus of claim 14, wherein the memory further includes data indicating a specific column RLE that indicates, for each column that includes one or more inputs mapped thereto, whether each cell of the column includes an input mapped thereto and wherein the processing circuitry is further configured to determine the input data is anomalous in response to determining either the specific column RLE indicates that no inputs are mapped to the cell to which the input maps.

\* \* \* \* \*